(12) United States Patent
Van Der Zaag et al.

(10) Patent No.: US 7,098,493 B2
(45) Date of Patent: Aug. 29, 2006

(54) MRAM IN-PIXEL MEMORY FOR DISPLAY DEVICES

(75) Inventors: Pieter J. Van Der Zaag, Waalre (NL); Martin J. Edwards, Crawley (GB); Kars-Michiel H. Lenssen, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/517,460

(22) PCT Filed: Jun. 4, 2003

(86) PCT No.: PCT/IB03/02466

§ 371 (c)(1),
(2), (4) Date: Jun. 10, 2005

(87) PCT Pub. No.: WO03/107316

PCT Pub. Date: Dec. 24, 2003

(65) Prior Publication Data

US 2005/0230723 A1    Oct. 20, 2005

(30) Foreign Application Priority Data

Jun. 12, 2002  (GB) ................................ 0213420.3

(51) Int. Cl.
*H01L 29/76*    (2006.01)

(52) U.S. Cl. ................. 257/295; 257/258; 257/E21.665
(58) Field of Classification Search ................. 257/295, 257/258, 59
See application file for complete search history.

(56) References Cited

U.S. PATENT DOCUMENTS 5,307,169 A * 4/1994 Nagasaki et al. ........... 348/307

\* cited by examiner

*Primary Examiner*—Andy Huynh
*Assistant Examiner*—Thinh T Nguyen
(74) *Attorney, Agent, or Firm*—Kevin Fortin (57) ABSTRACT

Magnetoresistive random access memory (MRAM) is used to provide in-pixel memory circuits for display devices. A memory circuit (25) comprises memory elements, for storing a drive setting, and a read-out circuit, for example a flip-flop circuit (64), for reading-out the stored drive setting. The memory elements comprise two MRAMs (60, 62), each coupled to a respective input of the flip-flop circuit (64). A drive circuit (26) is coupled to the read-out circuit and a pixel display electrode (27) for driving the pixel display electrode (27) dependent upon the read-out drive setting with drive current that does not pass through the MRAMs (60, 62). A display device (1) is provided comprising a plurality of pixels (20) each associated with one such memory circuit (25) and drive circuit (26).

7 Claims, 10 Drawing Sheets

MRAM IN-PIXEL MEMORY FOR DISPLAY DEVICES

This application is a 371 of PCT/IB03/02466 Jun. 4, 2003.

DESCRIPTION

The present invention relates to in-pixel memories and in-pixel memory circuits, particularly for display devices. The present invention is particularly suited to, but not limited to, providing in-pixel memory circuits in active matrix liquid crystal display devices.

Known display devices include liquid crystal, plasma, polymer light emitting diode, organic light emitting diode, and field emission. Such devices comprise an array of pixels, usually in rows and columns. In active matrix display devices, each pixel is typically associated with one or more respective switching devices, such as thin film transistors, to provide an array of pixels and switching devices. In operation, the pixels are addressed according to an addressing scheme in which each pixel is regularly refreshed for each frame to be displayed with display data (e.g. video) specifying the intensity level the pixel is to display. Usually the addressing scheme selects the pixels on a row-by-row basis and provides individual intensity levels on a column-by-column basis.

One development in the field of display devices is to provide in-pixel memories, whereby a respective memory device is provided for each pixel, the memory devices being arranged in an array corresponding to the pixel array. Static images may then be displayed without a need to refresh, thereby saving power. This is potentially particularly attractive for display devices for portable devices such as mobile telephones, cordless telephones, personal digital assistants, and so on.

It is known to use static random access memory (SRAM) and dynamic random access memory (DRAM) circuits for such in-pixel memory. Conventionally only one memory device (formed by a circuit) is provided for each pixel. A separate array of SRAM or DRAM circuits is provided in addition to the pixel and switching device array. This involves either a further entire manufacturing process in addition to that used for the pixel and switching device array, or the need for a large number of additional masking stages.

Quite separate from display device technology, one type of memory device is magnetoresistive random access memory (MRAM), in which a tunnel current depends on a magnetisation direction of two so-called magnetic electrodes. MRAM provides non-volatile memory. Use of such a memory (in applications unrelated to displays) is described for example in "Magnetoelectronic memories last and last . . . ", Mark Johnson, IEEE Spectrum, February 2000, pages 33–40.

One problem with the use of MRAM is that in operation MRAM provides, as its output, different resistance states (as opposed to e.g. a voltage change). Furthermore, the difference between the resistance states is low, usually less than 35%. Another problem is that if a conventional driving scheme were to be used with MRAMs the currents required to pass through the MRAMs to drive a pixel electrode, e.g. charge the effective capacitance of the liquid crystal layer at that pixel electrode, this may give rise to a need for voltages over the MRAM that are higher than is optimum for use with MRAMs in all circumstances.

The present invention uses MRAM technology to provide in-pixel memory for display devices, in ways that alleviate the problems described above.

In a first aspect, the present invention provides a memory circuit comprising one or more MRAMs coupled to a read-out circuit, and a drive circuit coupled to the read-out circuit. The drive circuit is arranged to be suitable to drive a pixel electrode directly, i.e. without drive current being delivered to the pixel electrode being passed through the one or more MRAMs.

The drive circuit preferably comprises a switching means, for example a transistor, coupled to a voltage reference source, for example a voltage reference line, arranged to control or enable flow of the drive current to the pixel electrode.

The memory circuit preferably comprises a switching device, for example a conventional active matrix TFT, arranged to switch according to received display data, and a bit line running from the switching device to the voltage reference source via one end of each of the one or more MRAMs.

The read-out circuit is preferably a flip-flop circuit. Preferably the memory circuit comprises two MRAMs, the flip-flop circuit comprises two inputs, and each of the two MRAMs is coupled to a respective one of the flip-flop circuit inputs.

In a further aspect the present invention provides a display device comprising a plurality of pixels and a plurality of memory circuits according to the first aspect, each pixel associated with or comprising a respective one of the memory circuits.

In a further aspect the present invention provides a drive line arrangement for an in-pixel memory in which a drive line, for example a bit line, is arranged to pass over and contact a first MRAM in a first direction and a second MRAM in a second direction, the first and second directions being in the plane of drive line and substantially opposite to each other. This provides opposite resistance states in the two MRAMs. Preferably the bit line is laid out such that it passes over the first MRAM then turns or meanders back on itself before passing over the second MRAM.

In further aspects the present invention provides memory circuits or structures including one or more MRAMs and a flip-flop circuit for use in applications other than display applications, for example as sensors, preferably medical sensors.

Further aspects are as claimed in the appended claims.

BRIEF DESCRIPTION OF THE DRAWING

Embodiments of the present invention will now be described, by way of example, with reference to the accompanying drawings, in which.

Figure 1:
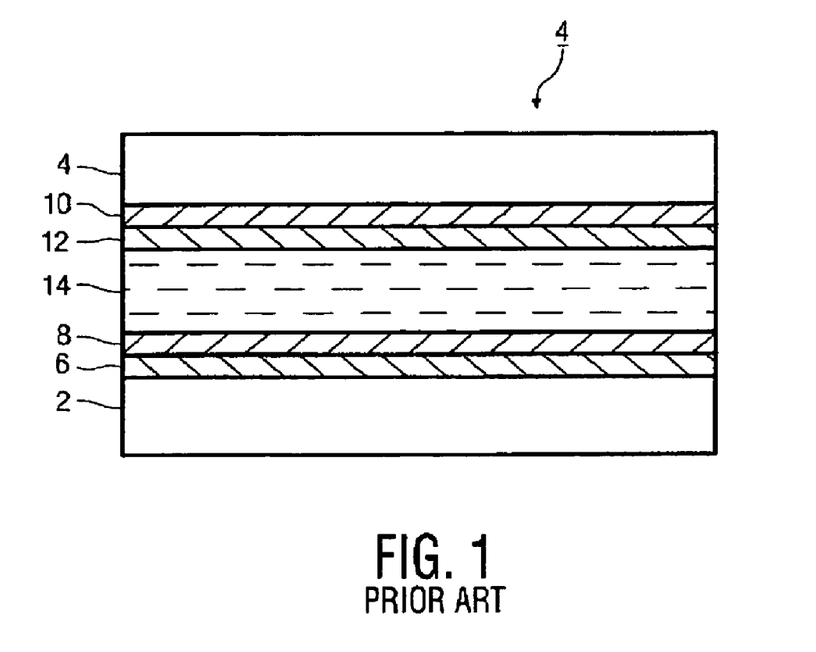
FIG. 1 is a schematic illustration (not to scale) of a liquid crystal display device.

FIG. 1 is a schematic illustration (not to scale) of a liquid crystal display device 1, comprising two opposed glass plates 2, 4 (or any other suitable transparent plates). The glass plate 2 has an active matrix layer 6, which will be described in more detail below, on its inner surface, and a liquid crystal orientation layer 8 deposited over the active matrix layer 6. The opposing glass plate 4 has a common electrode 10 on its inner surface, and a liquid crystal orientation layer 12 deposited over the common electrode 10. A liquid crystal layer 14 is disposed between the orientation layers 8, 12 of the two glass plates. Except for any active matrix details described below, in particular in relation to in-pixel memory, the structure and operation of the liquid crystal display device 1 is the same as the liquid crystal display device disclosed in U.S. Pat. No. 5,130,829, the contents of which are contained herein by reference.

Figure 2:
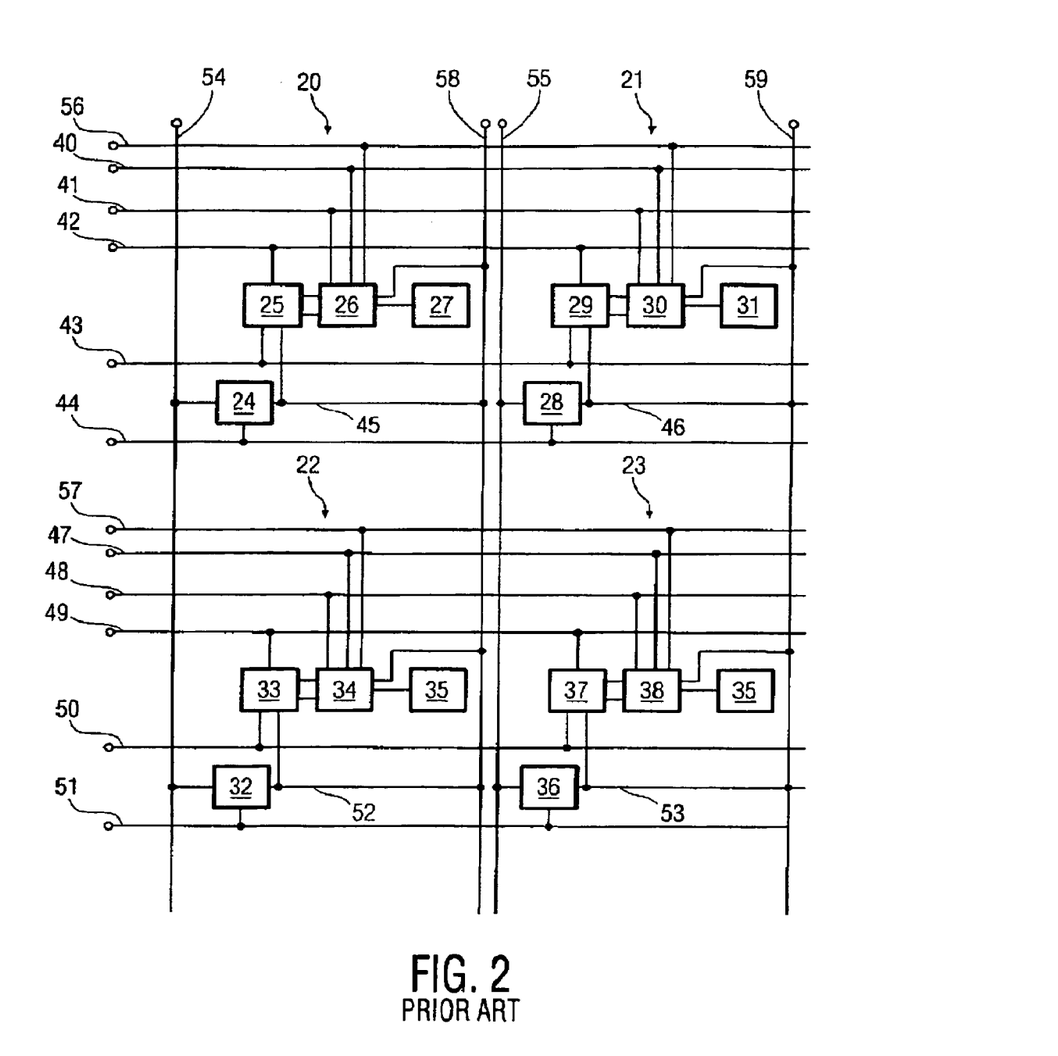
FIG. 2 is a schematic illustration of a sample 2×2 portion of an array of pixels.

Certain details of the active matrix layer 6, relevant to understanding this embodiment, are illustrated schematically in FIG. 2 (not to scale). The active matrix layer 6 comprises an array of pixels. Usually such an array will contain many thousands of pixels, but for simplicity this embodiment will be described in terms of a sample 2×2 portion of the array of pixels 20–23 as shown in FIG. 2.

In the field of display devices, there is often some variation in what is intended to be covered by the term "pixel". For convenience, in this example each pixel 20–23 is to be considered as comprising those elements of the active matrix layer 6 relating to that pixel in particular. The pixel 20 includes, inter-alia, a thin-film-transistor (TFT) 24, an in-pixel memory circuit 25, a drive circuit 26 and a pixel electrode 27. The TFT 24 and pixel electrode 27 are conventional, and may for example be as described in the earlier mentioned U.S. Pat. No. 5,130,829. The in-pixel memory circuit 25 and drive circuit 26 are not found in conventional liquid crystal devices, and will be described in more detail below.

The other pixels 21–23 comprise respective TFTs 28, 32, 36, in-pixel memory circuits 29, 33, 37, drive circuits 30, 34, 38 and pixel electrodes 31, 35, 39.

Also provided as part of the active matrix layer 6 is a plurality of addressing lines, as follows. Pixels 20 and 21 form a first row of the array of pixels, and pixels 22 and 23 form a second row of the array. The first row is provided with a number of driving and addressing lines, which for convenience are termed as follows: an enable line 56, a polarity line 40, a refresh line 41, a read line 42, a word line 43 and a gate line 44 extending across the whole row. Also, a bit line 45 is provided for pixel 20, and a bit line 46 is provided for pixel 21. Likewise, the second row is provided with an enable line 57, a polarity line 47, a refresh line 48, a read line 49, a word line 50 and a gate line 51 extending across the whole row, a bit line 52 for pixel 22, and a bit line 53 for pixel 23.

Pixels 20 and 22 form a first column of the array of pixels, and pixels 21 and 23 form a second column. The first column is provided with a column line 54. Likewise, the second column is provided with a column line 55. The first column is further provided with a voltage reference line 58, and the second column is further provided with a voltage reference line 59. These voltage reference lines may alternatively be provided on a row by row basis, or indeed using any other convenient layout.

By way of example, further details of the connections of the various pixel components and addressing lines, and operation of the pixels, will now be described for the case of pixel 20, but the following description applies in corresponding fashion to the other pixels 21–23.

The input to TFT 24 is connected to the column line 54, and the gate of the TFT is connected to the gate line 44, as in a conventional active matrix liquid crystal device. The output of the TFT 24 is connected to the bit line 45, which is connected to both the in-pixel memory circuit 25 and the voltage reference line 58. The word line 43 is connected to the in-pixel memory circuit 25. The read line 42 is connected to the in-pixel memory circuit. The enable line 56, the polarity line 40, the refresh line 41 and the voltage reference line 58 are each connected to the drive circuit 26. The in-pixel memory circuit has two separate connections to the drive circuit 26. The drive circuit 26 is connected to the pixel electrode. In the above described arrangement, the bit line 45 and the drive circuit 26 are each connected to a same voltage source in the form here of voltage reference line 58. Another possibility is for different voltage reference sources of different voltage level to be provided separately for the drive circuit 26 compared to the bit line 45.

In operation, as with conventional active matrix display devices, row selection is performed via the gate line 44 and intensity level data is provided via the column line 54. The output from the TFT 24 is effectively delivered by the bit line 45 to the in-pixel memory circuit 25, and driving of the pixel electrode 27 by the drive circuit 26 is controlled by the resulting memory setting of the in-pixel memory circuit 25, as will be described in more detail below. The drive circuit 26 and the in-pixel memory circuit 25 are further controlled by inputs provided via the enable line 56, the polarity line 40, the refresh line 41 and the read line 42, as will also be described in more detail below.

Figure 3:
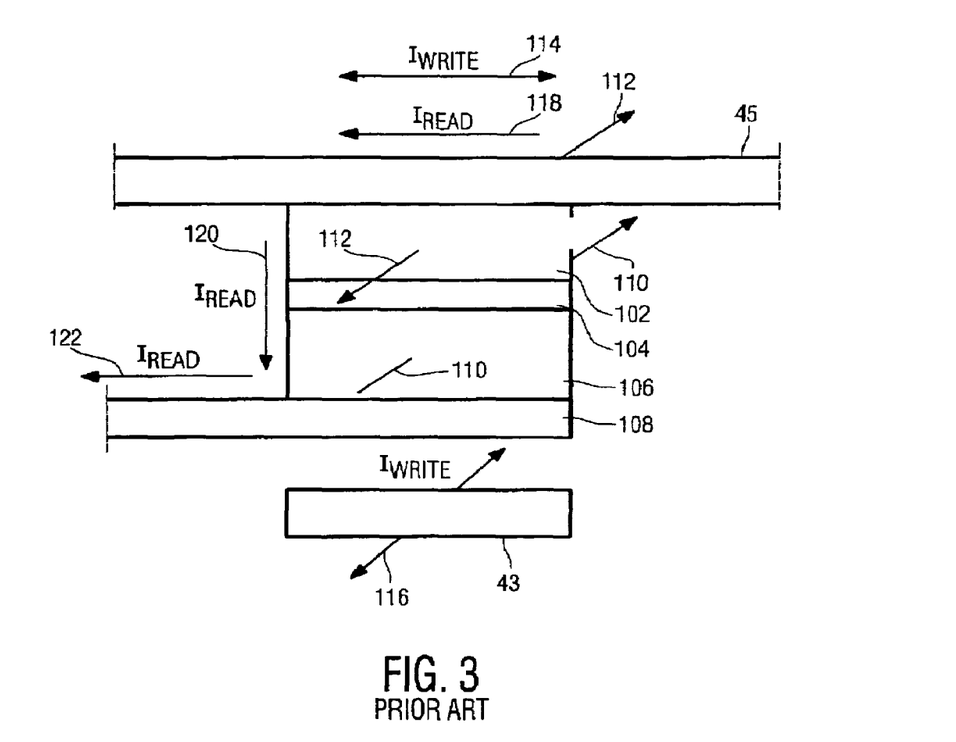
FIG. 3 is a schematic illustration of a simple MRAM stack.

Before describing the above mentioned features in further detail, it will be helpful to provide an outline summary of the operation of a MRAM structure. FIG. 3 shows a schematic illustration of a simple MRAM stack. The MRAM stack comprises two ferromagnetic layers, namely a free layer 102 and a pinned layer 106, each made for example of $Ni_{81}Fe_{19}$ and having a thickness of several nanometres, separated by an insulation layer 104, being for example 1 to 2 nm thick and made for example from $Al_2O_3$. The free layer 102 and the pinned layer 106 are each often referred to as magnetic electrodes. The insulation layer 104 serves as a tunnel barrier layer. An electrical contact is made with the free layer 102 and with the pinned layer 106. In this example, these are the bit line 45 and a contact 108 (in the pixel array embodiment shown in FIG. 2, such a contact of each MRAM is connected to the flip-flop circuit 64 via a respective flip-flop connection as will be described in more detail below). A further electrical supply line is provided below the MRAM stack but insulated therefrom. This further electrical supply line runs orthogonal to the bit line 45, i.e. in and out of the page in FIG. 3. In this example, this further electrical supply line is the word line 43.

The MRAM stack operates as follows. The pinned layer 106 has a fixed magnetisation orientation shown by arrow 110. The free layer is capable of being switched between two magnetic orientations, as indicated by double-headed arrow 112. A write current 114, 116 is applied to the bit line 45 and the word line 43 to control or set the magnetic orientation 112 of the free layer. This may be set either parallel to or anti-parallel to the magnetic orientation 110 of the pinned layer 106. These two possibilities are each stable when set if no further write current 114, 116 is applied.

These two states are distinguishable, i.e. capable of being read-out, as follows. A read-out current 118, 120, 122 may be passed through the MRAM stack from the bit line 45 to the contact 108 due to tunnelling of electrons through the tunnel barrier layer 104. The resistance encountered by this current depends upon the tunnelling resistance of the tunnel barrier layer 104, which itself directly depends upon whether the magnetic orientation 112 of the free layer 102 is parallel to or anti-parallel to the magnetic orientation 110 of the pinned layer 106. The maximum resistance variation of present MRAM stacks is however typically only about 35%.

Further details of the MRAM stacks employed in the present embodiment will be described later below, but these outline details should assist in understanding details of the pixel array being described, in particular the function of the word line 43 which passes under the MRAM stacks but does not directly connect to them, and the bit line 45 and contact 108 (connected in this embodiment to the flip-flop circuit 64) which are in direct contact with respective ends of the MRAM stack.

Figure 4:
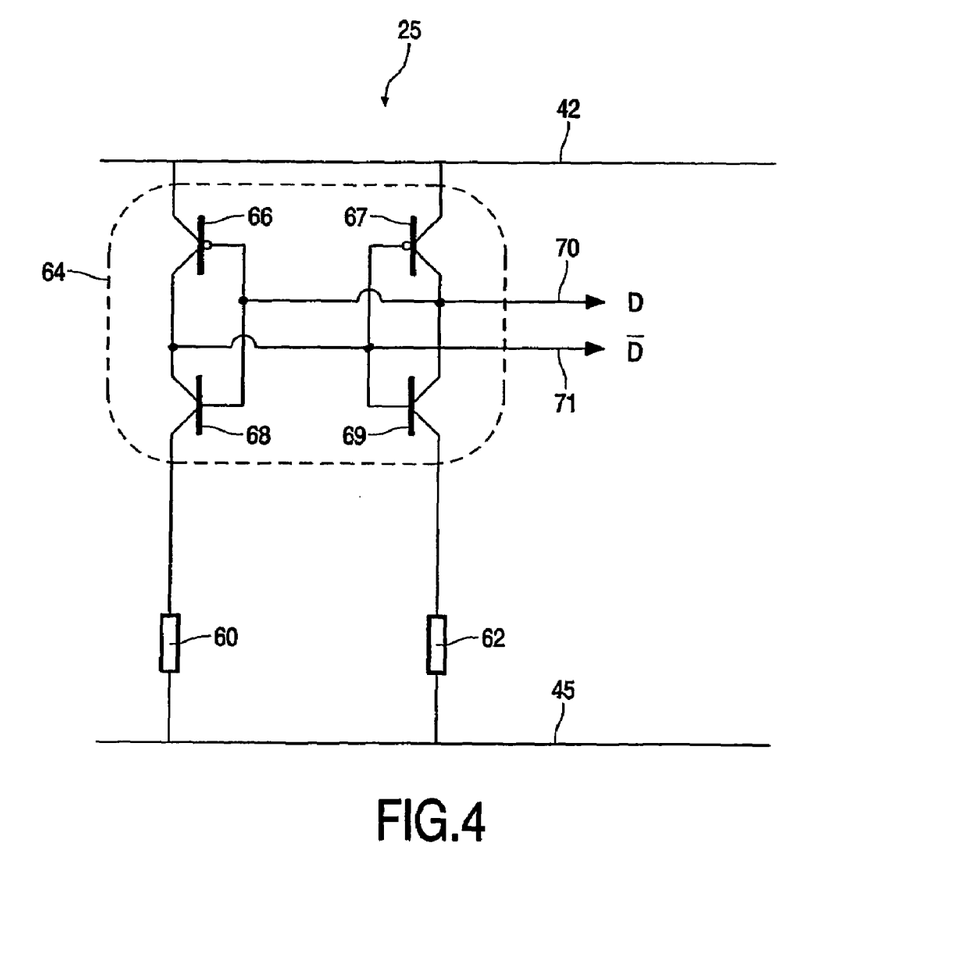
FIG. 4 is a circuit diagram of an in-pixel memory circuit.

FIG. 4 is a circuit diagram of the in-pixel memory circuit 25. The in-pixel memory circuit 25 comprises two MRAMs 60, 62 and a flip-flop circuit 64. The two MRAMs 60, 62 serve as memory elements; the flip-flop circuit 64 serves as a read-out circuit for reading out the memory state of the memory elements.

The flip-flop circuit 64 comprises two p-type transistors, implemented as TFTs and hereinafter referred to as a first p-type TFT 66 and a second p-type TFT 67; and two n-type transistors, implemented as TFTs and hereinafter referred to as a first n-type TFT 68 and a second n-type TFT 69. The TFTs are arranged to provide in effect two input chains, a first input chain, in this example comprising the first p-type TFT 66 and first n-type TFT 68, connected to the first MRAM 60, and a second input chain, in this example comprising the second p-type TFT 67 and the second n-type TFT 69, connected to the second MRAM 62. The remaining end of each of the input chains of the flip-flop circuit 64 is connected to the read line 42. The respective other ends of the first MRAM 60 and the second MRAM 62 are connected to the bit line 45. (Operation of the MRAMs also involves the word line 43, as will be described later below, but for clarity this is not shown in FIG. 4.) The flip-flop circuit comprises two output connections, hereinafter referred to as a first output connection 70 and a second output connection 71, which provide the two (complementary) flip-flop circuit outputs, represented, as is conventional, as D and $\overline{D}$ in FIG. 4.

In this example the detailed connections of the flip-flop circuit 64 components are as follows. Each TFT 66–69 comprises, in conventional fashion, one gate and two source/drain terminals (hereinafter referred to as a first and a second terminal). In operation, one of the source/drain terminals functions as the source of the TFT and the other of the source/drain terminals functions as the drain of the TFT. The question of which source/drain terminals serves as the source and which serves as the drain at any particular moment is determined by the polarity of the applied voltage at that moment.

The first terminal of the p-type TFT 66 and the first terminal of the second p-type TFT 67 are connected to each other and to the read line 42. The gate of the first p-type TFT 66, the gate of the first n-type TFT 68, the second terminal of the first p-type TFT and the first terminal of the second n-type TFT 69 are connected to each other and to the first output connection 70. The second terminal of the first p-type TFT 66, the first terminal of the first n-type TFT 68, the gate of the second p-type TFT 67 and the gate of the second n-type TFT 69 are connected to each other and to the second output connection 71. The second terminal of the first n-type TFT 68 is connected to the first MRAM 60. The second terminal of the second n-type TFT 69 is connected to the second MRAM 62.

In operation, the MRAMs are set at particular resistance states using the bit line 45 and word line 43, and these states are read-out by the flip-flop circuit 64 operating as follows. Initially the bit line 45 and the read line 42 are at the same potential, for example 0V. The voltages on the two nodes of the flip flop, 70 and 71, will be substantially the same. In order to read the state of the MRAMs the read line is made positive with respect to the bit line, for example by switching it from 0V to 3V, thus applying a power supply voltage to the flip flop circuit. The voltages on both nodes of the flip flop circuit will initially start to charge towards the mean value of the voltages on the bit and read lines, 1.5V. The rate of change of the voltages on the nodes will depend on the resistance of the MRAM elements, the resistance of the TFTs and the capacitance of the nodes of the circuit. One of the MRAM elements will have a lower resistance than the second. For example the resistance of MRAM element 60 may be lower than MRAM element 62. In this case the voltage on the flip flop node 70 will become more positive than that on node 71. This voltage difference is then amplified by the positive feedback within the flip flop circuit so that node 70 settles at the potential on the read line, 3V, and node 71 settles at the voltage on the bit line, 0V.

Figure 5:
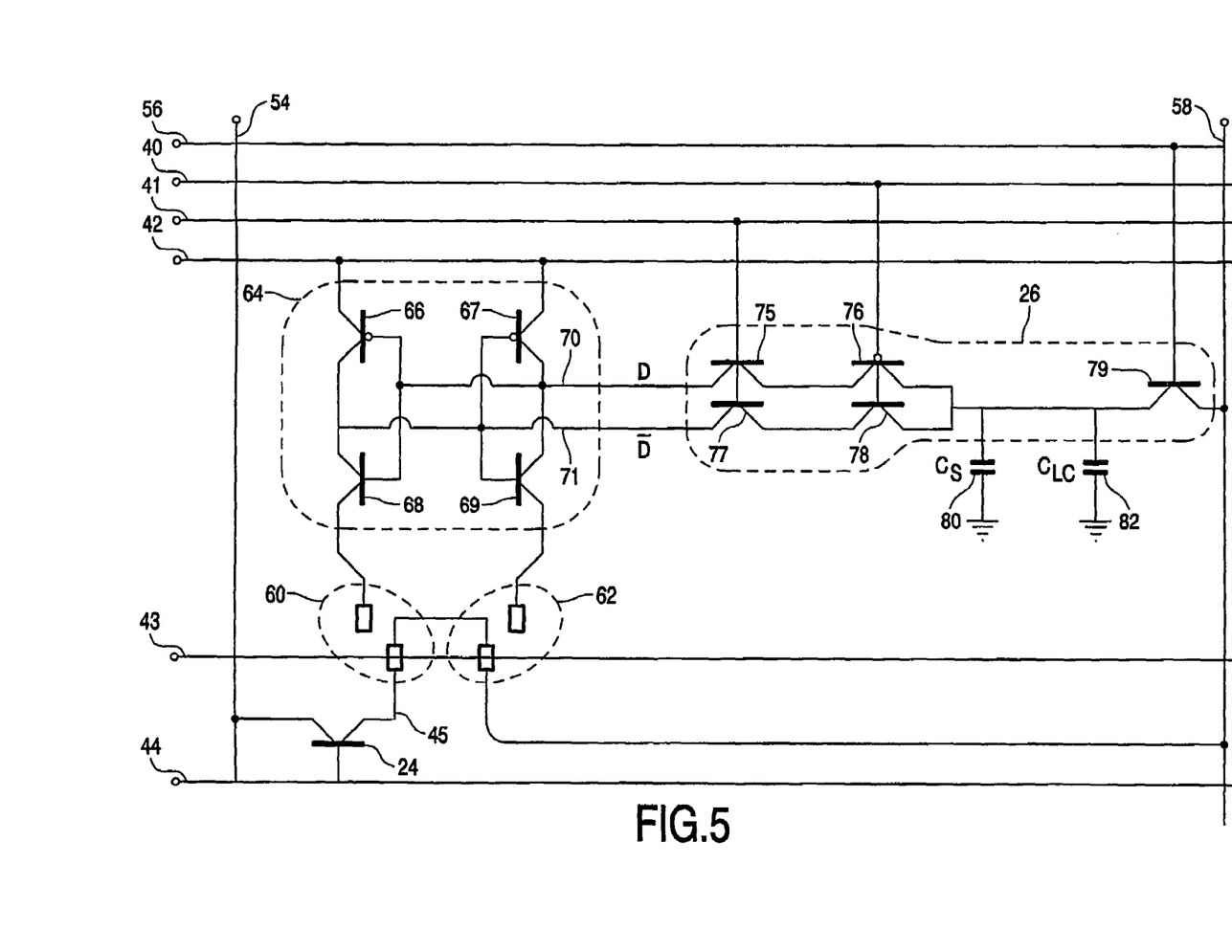
FIG. 5 shows a pixel and in-pixel memory arrangement including two MRAMs, a read-out circuit and a drive circuit.

FIG. 5 shows further details of the overall pixel circuitry for the pixel 20. In addition to those items already described above (and indicated by the same reference numerals as used above), FIG. 5 shows further details of the drive circuit 26, and its connection to the pixel electrode 27. This connection to the pixel electrode 27 is shown in circuit terms, as is conventional, as connection to a storage capacitor 80 of capacitance $C_s$ and a capacitance $C_{LC}$ of the liquid crystal cell formed by the liquid crystal layer 14 between the pixel electrode 27 and the opposing common electrode 10.

The drive circuit 26 comprises, in this example, five transistors, implemented as TFTs and hereinafter referred to as a first drive circuit TFT 75, a second drive circuit TFT 76, a third drive circuit TFT 77, a fourth drive circuit TFT 78 and a fifth drive circuit TFT 79. The second drive circuit TFT 76 is a p-type TFT; the other four drive circuit TFTs 75, 77, 78, 79 are n-type TFTs. The drive circuit TFTs 75–79 are arranged to provide a single drive input to the pixel electrode 27 based on the two outputs D and $\overline{D}$ from the flip-flop circuit 64.

In this example the detailed connections of the drive circuit TFTs 75–78 are as follows. The gates of the first drive circuit TFT 75 and the third drive circuit TFT 77 are connected to each other and to the refresh line 41. The gates of the second drive circuit TFT 76 and the fourth drive circuit TFT 78 are connected to each other and to the polarity line 40. The first terminal of the first drive circuit TFT 75 is connected to the first flip-flop output connection 70. The first terminal of the third drive circuit TFT 77 is connected to the second flip-flop output connection 71. The second terminal 75 of the first drive circuit TFT 75 is connected to the first terminal of the second drive circuit TFT 76. The second terminal of the third drive circuit TFT 77 is connected to the first terminal of the fourth drive circuit TFT 78. The second terminal of the second drive circuit TFT 76 and the second terminal of the fourth drive circuit TFT 78 are connected to each other, to the first terminal of the fifth drive circuit TFT 79 and to the pixel electrode 27, i.e. to the storage capacitor 80 and the liquid crystal capacitance 82. The gate of the fifth drive circuit TFT 79 is connected to the enable line 56. The second terminal of the fifth drive circuit TFT 79 is connected to the voltage reference line 58.

In operation, signals are applied to the polarity line 40, the refresh line 41, the read line 42, the word line 43, the gate line 44 and the column line 54 as follows, and consequently the drive circuit operates as follows to provide the required input to the pixel electrode 27, i.e. to the storage capacitor 80 and the liquid crystal capacitance 82. One way in which the circuits of FIG. 5 may be operated in order to provide appropriate drive signals for the liquid crystal capacitance is as follows. The liquid crystal normally requires a drive voltage waveform which alternates in polarity with respect to the common electrode of the display. This is achieved by driving the pixel with positive and negative drive signals in successive pixel refresh periods. In order to refresh the pixel electrode with a positive drive signal the data must first be read from the MRAMs. Initially the word line and the read line are at the same potential, for example 0V. The read line is then switched to a positive voltage level, for example 3V, and the flip flop circuit 64 takes on a state determined by the state of the MRAMs. If MRAM 60 has a higher resistance than MRAM 62 then node 70 will settle at a voltage level of 0V and node 71 will settle at a voltage of 3V. The pixel is refreshed by taking the signal on the refresh line from a low voltage level to a high voltage level. This turns on the two transistors 75 and 77 allowing the data voltages generated by the flip flop circuit to be passed to the liquid crystal capacitance. During the positive refresh period the polarity line is held at a high voltage level. This turns on transistor 78 so that the liquid crystal capacitance becomes charged to the voltage present on node 71 which in this example is 3V. After the liquid crystal capacitance has been charged the refresh line is returned to a low voltage level, turning off transistors 75 and 77 and the voltage on the read line is returned to 0V.

In order to refresh the pixel electrode with a negative drive signal the data must again be read from the MRAMs but in this case this is achieved by taking the word line to a negative voltage level, for example −3V. If MRAM 60 has a higher resistance than MRAM 62 then node 70 will settle at a voltage level of −3V and node 71 will settle at a voltage of 0V. The pixel is refreshed by once again taking the signal on the refresh line from a low voltage level to a high voltage level. During the negative refresh period the polarity line is held at a low voltage level. This turns on transistor 76 so that the liquid crystal capacitance becomes charged to the voltage present on node 70 which in this example is −3V. After the liquid crystal capacitance has been charged the refresh line is returned to a low voltage level, turning off transistors 75 and 77 and the voltage on the read line is again returned to 0V.

In the case where the resistance of MRAM 60 is higher than that of MRAM 62 the liquid crystal capacitance is driven with a voltage waveform having an amplitude of 6V. In the case where a normally white transmissive TN LC effect is being employed this would cause the pixel to be dark. If the relative resistance of the MRAMs is reversed so that MRAM 60 has a lower resistance than MRAM 62 then the voltages generated on the two nodes of the flip flop, 70 and 71, would also be reversed. As a result a voltage of 0V would be applied to the liquid crystal capacitance in both the positive and negative refresh periods. This would cause the liquid crystal pixel to appear light.

While the pixel is being operated using data from the MRAM rather than data supplied via the column line the gate line is held at a low voltage in order to keep transistor 24 in a non-conducting state.

The MRAMs, 60 and 62, and the flip flop circuit 64 provide a means of supplying drive signals to the liquid crystal which switch the pixel to either a light state or a dark state. The power consumption of the display can be relatively low when the pixels are supplied with data from the MRAM since it is not necessary to supply the pixels with data from external circuitry. However, it may be desirable to operate the display is a second mode in which grey levels can be reproduced. This can be achieved by using the reference electrode 58, the enable line 56 and the thin film transistor 79 in order to address the pixel with a grey level drive voltage in a similar way to that by which a conventional active matrix LC display is addressed. The reference electrodes 58, 59 of the display are addressed with signals equivalent to the column drive signals in a conventional active matrix LCD. The enable lines 56, 57 are addressed with selection pulses equivalent to the row drive signals in a conventional active matrix LCD. In this way all of the pixels within the display can be addressed line by line in order to produce a grey scale image on the display.

In the above described version of drive circuit 26, in some circumstances the status of the flip-flop may not be completely determined initially, or it may not be completely discharged between frames. This may leave remaining charge which may skew a read-out from the MRAMs. This is avoided or alleviated in another possible version of the drive circuit 26, in which the p-type TFT 76 and the n-type TFT 77 are omitted, i.e. the drive circuit instead comprises just the n-type TFT 75, the n-type TFT 78 and the n-type TFT 79. Then, although the TFTs 75, 78 may normally be alternated to change the polarity on the liquid crystal, they may instead both be switched on so as to reset the flip-flop circuit 64.

The above described circuitry, in particular the provision of the drive circuit 26 such that drive current is provided directly to the pixel electrode 27, i.e. storage capacitor 80 of capacitance $C_s$ and the capacitance $C_{LC}$ of the liquid crystal cell, means that the pixel electrode 27 is driven without drive current passing through the MRAMs 60, 62. Thus the possibility of too high a voltage over the MRAMs, e.g. 12V, is avoided.

Figure 6:
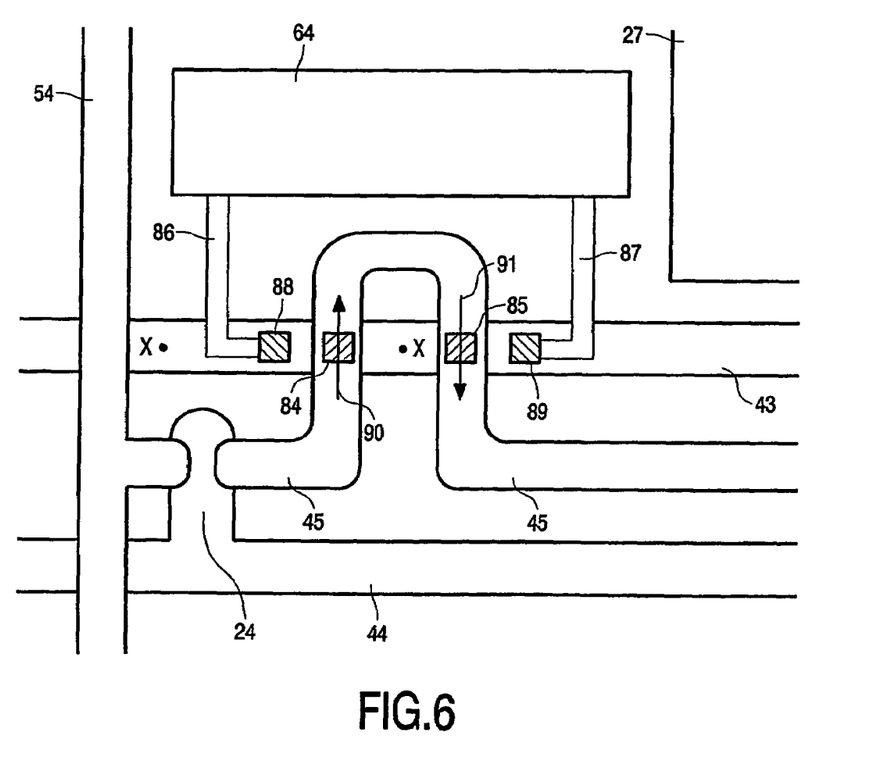
FIG. 6 shows a schematic diagram, not to scale, of a constructional layout employed for a pixel.

FIG. 6 shows a schematic diagram, not to scale, of the constructional layout employed for the pixel 20 in this embodiment. For clarity, the drive circuit 26, the enable line 56, the polarity line 40, the refresh line 41 and the read line 42 are not shown. Indeed, the benefits of the constructional layout to be described below are achieved independently of these items that are not shown. Those items already mentioned above which are shown in FIG. 6 are the word line 43, the gate line 44, the TFT 24, the column line 54, the bit line 45, the pixel electrode 27 and the flip-flop circuit 64.

Figure 7:
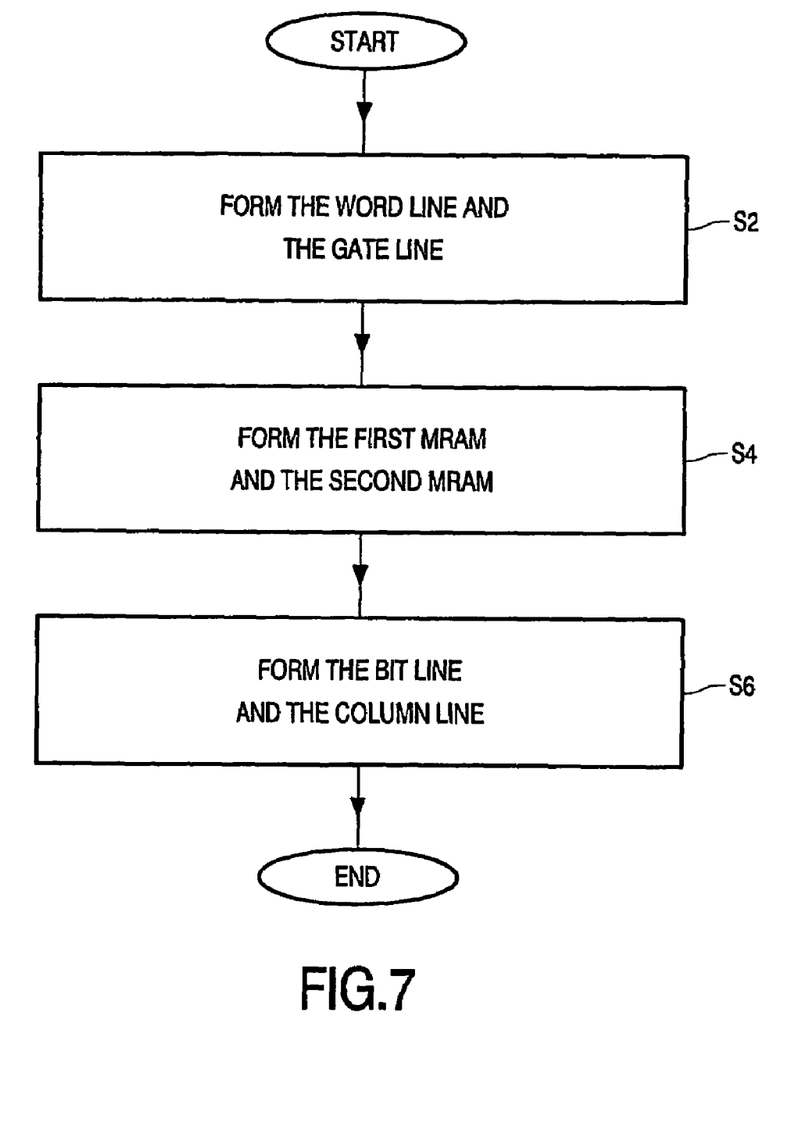
FIG. 7 is a flowchart showing certain process steps used to form an in-pixel memory structure.

The various components and lines are each formed using conventional thin film deposition, masking and etching processes, as for conventional active matrix display devices. FIG. 7 is a flowchart showing certain process steps used to form the in-pixel memory structure shown FIG. 6.

At step s2, the word line 43 and the gate line 44 are formed in the same masking stage. Thus, advantageously, the word line 43, which is used in relation to operation of the in-pixel memory and would not be present in a conventional active matrix display device without in-pixel memory, is provided during a masking stage that is anyway needed for the conventional device (to provide the gate line 44), i.e. without the need for an additional masking stage. Also, the gate dielectric may be used to form a dielectric layer between the MRAM and the word line 43.

At step s4, the first MRAM 60 and the second MRAM 62 are formed as respective MRAM stacks above the word line 43, using a half tone mask. This represents one of only two additional mask steps (compared to a conventional active matrix display device) required in this embodiment to add the additional features shown in FIG. 6. The positions of the MRAM stacks of the first MRAM 60 and the second MRAM 62, as viewed from above, are indicated by items 84 and 85 respectively.

At step s6 the bit line 45 and the column line 54 are formed in the same masking stage as each other. Thus, advantageously, the bit line 45, which is used in relation to operation of the in-pixel memory and would not be present in a conventional active matrix display device without in-pixel memory, is provided during a masking stage that is anyway needed for the conventional device (to provide the column line 54), i.e. without the need for an additional masking stage.

Also formed at step s6, i.e. this masking stage, are two connections hereinafter referred to as a first flip-flop connection 86 and a second flip-flop connection 87. The first flip-flop connection 86 connects the flip-flop circuit 64 to a first contact-via connected to the bottom of the first MRAM 60, i.e. effectively connects the first n-type TFT 68 of the flip-flop circuit 64 to the first MRAM 60. The position of the first contact-via as viewed from above is shown by item 88 in FIG. 6. Likewise, the second flip-flop connection 87 connects the flip-flop circuit 64 to a second contact-via connected to the bottom of the second MRAM 62, i.e. effectively connecting the second n-type TFT 69 of the flip-flop circuit 64 to the second MRAM 62. The position of the second contact-via as viewed from above is shown by item 89 in FIG. 6. (Forming the contact-vias represents the second of the two additional mask steps, compared to a conventional active matrix display device, required in this embodiment to add the additional features shown in FIG. 6.)

Returning to considering the bit line 45, another optional advantageous feature is included in this embodiment, as follows. The bit line 45 is arranged so that a current flowing along it passes or crosses over the first MRAM 60 in a first direction (in terms of FIG. 6, in the direction up the page as indicated by arrow 90) and passes or crosses over the second MRAM 62 in a second direction (in terms of FIG. 6, in the direction down the page as indicated by arrow 91), the first and second directions being substantially opposing directions (in the plane of the bit line). This has the effect of producing different, i.e. opposite resistance states between the first MRAM 60 and the second MRAM 62, since in one MRAM stack the current will produce a magnetic field into the page (i.e. down the respective MRAM stack) and in the other MRAM stack the current will produce a magnetic field out of the page (i.e. up the other MRAM stack). This arrangement of the bit lane advantageously increases the distinction achieved in the overall resistance states of the pair of MRAMs.

In this embodiment the bit line 45 is arranged to pass over the two MRAMs in substantially opposing directions by laying out the bit line 45 as shown in FIG. 6, i.e. if one considers a hypothetical reference line between the positions of the first and second MRAMs, the bit line 45 passes over the first MRAM 60 in a direction substantially perpendicular to the reference line, then turns on itself, and then also passes over the second MRAM 62 in a direction substantially perpendicular to the reference line, but in the opposite sense, i.e. substantially 180° different to the first pass. In other words, the bit line is laid out such that it passes over the first MRAM 60 then turns or meanders back on itself before passing over the second MRAM 62.

Yet another advantageous feature is included in this embodiment, as follows. The word line 43 is positioned between the gate line 44 and the pixel electrode 27. This means the bit line 45 does not need to pass over the gate line 44. This reduces the amount of overlap capacitance that would otherwise be caused by the bit line 45 overlapping the gate line 44.

Figure 8:
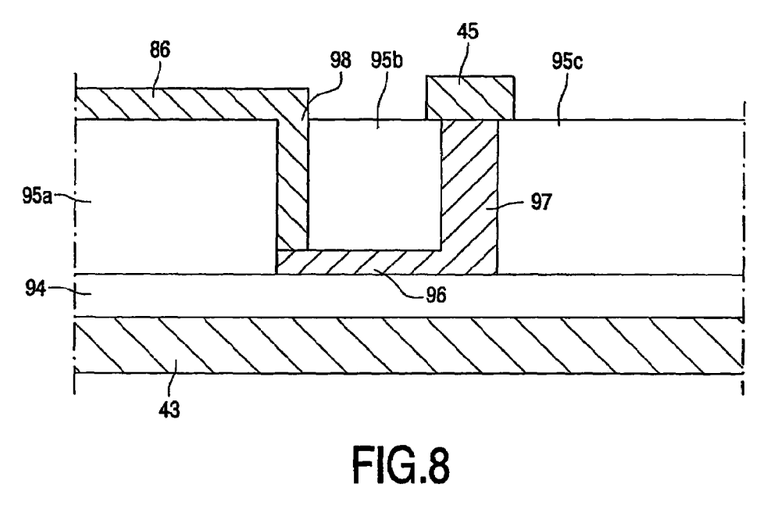
FIG. 8 shows a cross-section between points X—X indicated in FIG. 6.

Further details of the construction of the in-pixel memory of this embodiment will now be described with reference to FIG. 8 which shows a cross-section between the points X—X indicated on FIG. 6. The word line 43 runs along the bottom of the section. A dielectric layer 94 is present over the word line 43, insulating the word line 43 from the MRAM (as mentioned earlier, this dielectric layer 94 may be formed using the gate dielectric layer). A conductor layer, which will serve as a MRAM contact extension 96, is provided on the dielectric layer 94. A further dielectric layer 95a, 95b, 95c is provided over and around the MRAM contact extension 96. The MRAM stack 97 of the first MRAM 60 is formed at one end of the MRAM contact extension 96. The bit line 45 is provided over the top of the MRAM stack 97. A contact-via 98 is provided above the other end of the MRAM contact extension 96. The first flip-flop connection 86 runs along the further dielectric layer 95a to the contact-via 98. Thus connection is made between the flip-flop circuit 64 and the MRAM stack 97, via the contact-via 98 and the MRAM contact extension 96. It will be appreciated that in other embodiments such connection can be made in any other convenient manner.

The present invention may be embodied using any appropriate MRAM stacks, for example simple ones as described above with reference to FIG. 3. However, in this embodiment a preferred MRAM stack design is employed.

Figure 9:
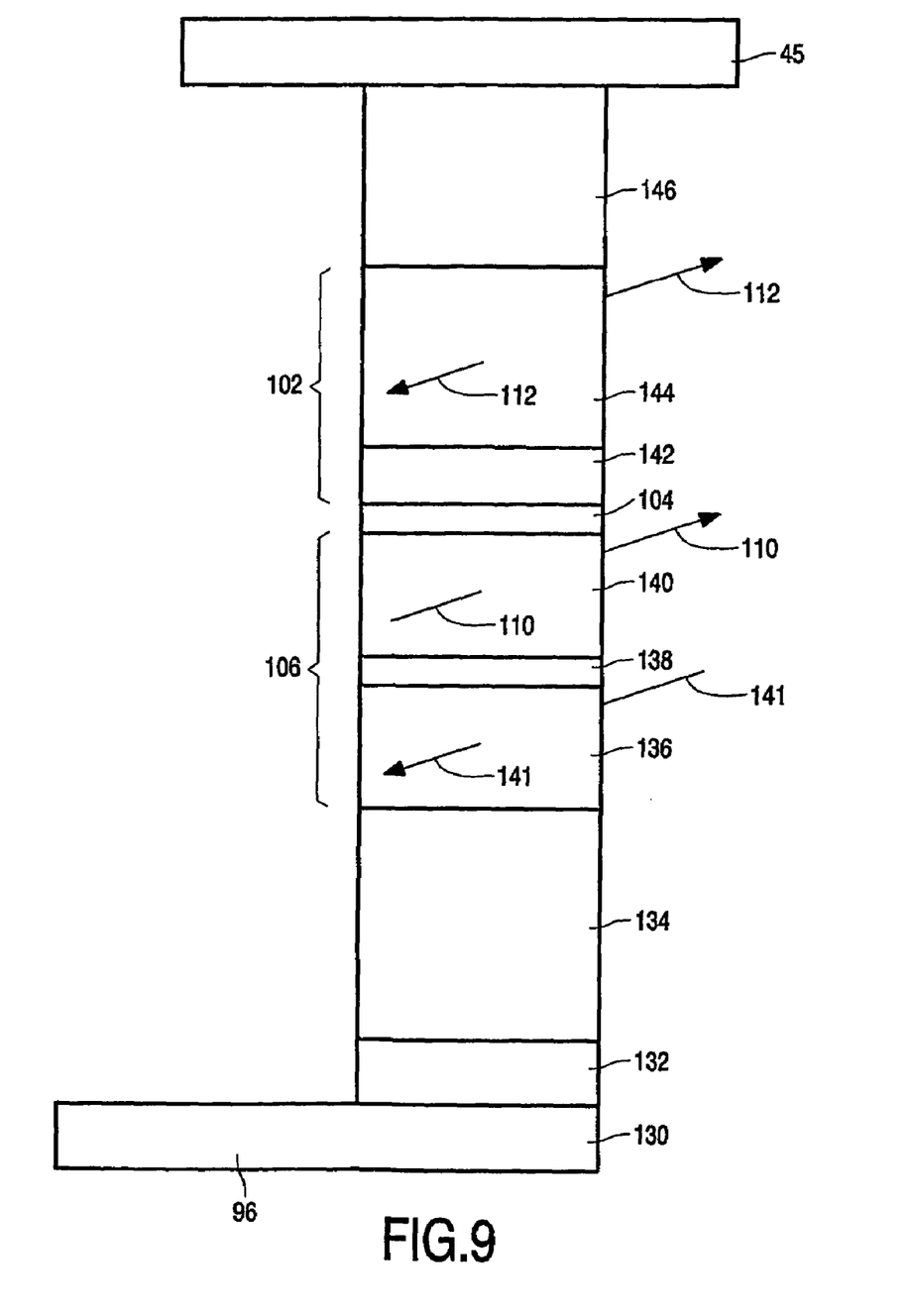
FIG. 9 shows a preferred MRAM stack in cross-section (not to scale)

FIG. 9 shows this preferred MRAM stack in cross-section (not to scale). The layers will now be described in the order they are deposited during formation of the MRAM stack, this being up the page as shown in FIG. 9. The bottom contact is in this embodiment the previously described MRAM contact extension 96, which extends beyond the edge of the rest of the MRAM stack to allow contact as described earlier. The MRAM contact extension 96 is an approximately 3.5 nm thick Ta layer, and serves also as a buffer layer in terms of the mechanical properties and deposition process for the MRAM stack.

The next layer is a (conducting) layer 132 comprising an approximately 2 nm thick layer of $Ni_{81}Fe_{19}$. The next layer is an exchange-biasing layer 134 comprising an approximately 20 nm thick layer of $Pt_{50}Mn_{50}$.

The next layer is a pinned layer 106 (using the same reference numeral as in FIG. 3), i.e. magnetic electrode. This pinned layer 106 is here made up of three layers, i.e. a first $Co_{90}Fe_{10}$ layer 136 of approximate thickness 3 nm, a Ru layer 138 of approximate thickness 0.8 nm and a second $Co_{90}Fe_{10}$ layer 140 of approximate thickness 3 nm. The second $Co_{90}Fe_{10}$ layer 104 has the fixed magnetic orientation 110 described earlier in FIG. 3. The first $Co_{90}Fe_{10}$ layer 136 has a fixed magnetic orientation 141 that is anti-parallel to the fixed magnetic orientation 110 of the second $Co_{90}Fe_{10}$ layer 104. The use of two such coupled layers instead of one single ferromagnetic layer is known in the art of ferromagnetism as using an artificial antiferromagnetic layer, also referred to as a synthetic ferrimagnet. Further details of the composition may be found in patent WO99/58994, which is incorporated herein by reference.

The next layer is a tunnel barrier layer 104 (using the same reference numeral as in FIG. 3), which here comprises an approximately 0.8 nm thick layer of oxidized Al.

The next layer is a free layer 102 (using the same reference numeral as in FIG. 3). This free layer 102 is here made up of two layers, i.e. a $Co_{90}Fe_{10}$ layer of approximate thickness 4 nm and a $Ni_{80}Fe_{20}$ layer of approximate thickness 10 nm, with two switchable and opposing magnetic orientations shown by double-headed arrow 112 (using the same reference numeral as in FIG. 3).

The next layer is a protective (conducting) layer 146 comprising an approximately 10 nm thick Ta layer.

The top contact is provided by the bit line 45, as described earlier above.

Figure 10:
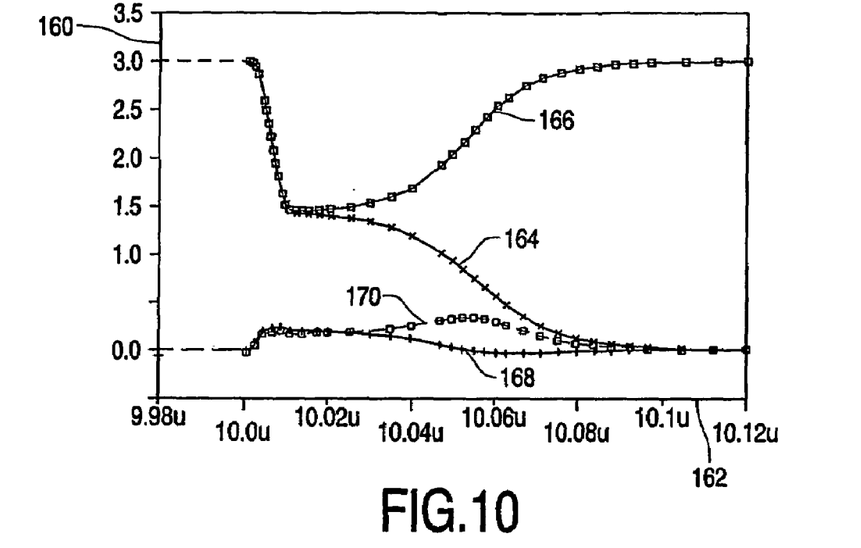
FIGS. 10 and 11 show the results of simulations performed for the in-pixel memory circuit described with reference to FIG. 4.
Figure 11:
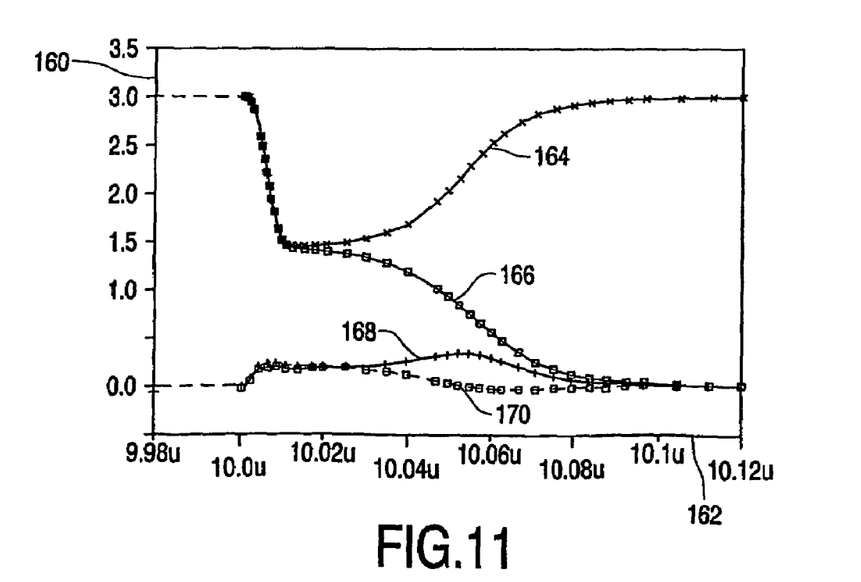

FIGS. 10 and 11 show the results of simulations performed for the in-pixel memory circuit described with reference to FIG. 4. FIG. 10 shows the results for one of the states of the two MRAMs 60, 62. FIG. 11 shows the results for the other of the states of the two MRAMs 60, 62. In both FIGS. 10 and 11, the x-axis 162 is time in microseconds, the y-axis 160 is voltage in volts, plot 164 shows the first output D of the flip-flop circuit 64, plot 166 shows the second (complementary) output $\overline{D}$ of the flip-flop circuit 64, plot 168 shows the voltage across the first MRAM 60, and plot 170 shows the voltage across the second MRAM 62. The difference in the resistance of the two MRAMs was taken as 24% (i.e. one of the pair has a resistance 12% higher than the average value and the other has a resistance 12% lower than the average) with the average resistance of the two MRAMs being 50 kΩ. The simulation results show that the voltage over the MRAMs is no greater than 0.57V, which is satisfactory since this is below the breakdown voltage level of the tunnel junction which is typically about 1V. The values of the threshold voltages of the TFTs 66–69 used in the simulation were about 1V, which represents a low threshold voltage device compared to many used in production. The plots of D (164) and $\overline{D}$ (166) show successful provision of distinct logical outputs capable of driving the active matrix display device.

The embodiment described above comprises a number of advantageous features in combination. However, in other embodiments many of these may be implemented singly or in any combination of two or more, as for example in the following cases.

In further embodiments, the circuit arrangements described with reference to FIG. 2 and/or FIG. 3 and/or FIG. 5 are employed, but with any suitable constructional layout and formed by any suitable deposition process being employed rather than those described above. Another possibility is for the MRAM and flip-flop arrangement to be as described above, but with any suitable drive circuit rather than the drive circuit described above, provided the current passing through the MRAMs is not used to charge the pixel electrode. Similarly, other flip-flop circuit designs, or other read-out circuits not employing a flip-flop circuit, and/or other MRAM stack designs, and/or pixel electrode details, and/or switching component details, and/or drive line details, and so on may be used instead of those described above.

In a further embodiment, the use of a flip-flop circuit may be used to fetch out the differing resistance state of a single MRAM serving as in-pixel memory.

In further embodiments, more than two MRAMs may be provided for each pixel, and arranged in any suitable manner for providing for example increased read-out capability. For example, if four MRAMs are provided for each pixel, the bit line may be arranged to pass over two of the MRAMs in one direction and over the other two MRAMs in the opposing direction.

In further embodiments, two (or more) MRAMs may be provided for a single pixel, to provide increased read-out capability, but using any suitable read-out arrangement rather a flip-flop circuit. In particular, the two (or more) MRAMs may be arranged such that a write current passes over them in opposing directions such that differing resistance states are directly provided.

In other embodiments, two (or more) MRAMs may be arranged such that a write current passes over them in opposing directions such that differing resistance states are directly provided, and the arrangement by which the write current passes over in the opposing directions may be implemented in any suitable manner, i.e. not necessarily by means of the bit line pattern or concepts described above.

In other embodiments, in the deposition process, the word line is provided at the same stage as the gate line, for any suitable in-memory pixel design.

In other embodiments, in the deposition process, the bit line is deposited at the same stage as the column line, for any suitable in-memory pixel design.

In other embodiments, the bit line is positioned between the pixel electrode and the gate line, such that the bit line does not pass over the gate line, for any suitable in-memory pixel design.

In other embodiments the above possibilities may be applied to other types of active matrix.

In other embodiments the above possibilities may be applied to devices using other types of liquid crystal, or indeed any other suitable display device type, including for example plasma, polymer light emitting diode, organic light emitting diode, and field emission display devices.

In other embodiments, memory structures or circuits comprising two or more MRAMs and a flip-flop circuit may be employed in applications other than display devices. For example, they may be used for sensors, for example medical sensors.

What is claimed is:

1. A pixel and in-pixel memory for a display device, comprising:
   a pixel display electrode;
   one or more magnetoresistive random access memories, MRAMs, for storing a drive setting;
   a read-out circuit coupled to the one or more MRAMs;
   a drive circuit coupled to the read-out circuit and the pixel display electrode for driving the pixel display electrode dependent upon the read-out drive setting with drive current that does not pass through the one or more MRAMs.

2. A pixel and in-pixel memory as claimed in claim 1, wherein the drive circuit comprises a transistor coupled to a voltage reference and arranged to control flow of the drive current from the drive circuit to the pixel display electrode.

3. A pixel and in-pixel memory according to claim 1, further comprising a switching device arranged to switch according to received display data, and a bit line running from the switching device to the voltage reference via one end of each of the one or more MRAMs.

4. A pixel and in-pixel memory according to any preceding claim, wherein the read-out circuit comprises a flip-flop circuit.

5. A pixel and in-pixel memory according to claim 4, comprising two MRAMs, and the flip-flop circuit comprising two inputs, each of the two MRAMs being coupled to a respective one of the flip-flop circuit inputs.

6. A display device comprising a plurality of pixels and in-pixel memories each according to claim 1.

7. A display device according to claim 6, comprising a liquid crystal layer for driving by the pixel display electrodes.

* * * * *